United States Patent [19]

Meyers et al.

[11] Patent Number: 5,268,688
[45] Date of Patent: Dec. 7, 1993

[54] LINEAR SIGNAL RECONSTRUCTION SYSTEM AND METHOD

[75] Inventors: Clifford W. Meyers, Rancho Palos Verdes; Sandy A. Morales, Hermosa Beach; Gene Rzyski, Cypress; Mark M. Osugi, Long Beach, all of Calif.

[73] Assignee: Hughes Aircraft Company, Los Angeles, Calif.

[21] Appl. No.: 882,212

[22] Filed: May 13, 1992

[51] Int. Cl.$^5$ .................................................. H03M 1/66
[52] U.S. Cl. ........................................ 341/143; 341/144
[58] Field of Search ................ 341/143, 144, 150, 152

[56] References Cited

U.S. PATENT DOCUMENTS 3,956,700  5/1976  Condon ................................. 341/143
4,214,231  7/1980  Donnally ............................... 341/110
5,068,661  11/1991 Kaneaki et al. ...................... 341/143

Primary Examiner—Marc S. Hoff
Attorney, Agent, or Firm—L. A. Alkov; W. K. Denson-Low

[57] ABSTRACT

Linear signal reconstruction systems and methods that use mathematical relationships that exist between discrete time signals, digital to analog conversion characteristics and digital signal processing to produce a highly accurate, low noise, arbitrary analog signal from a discrete digital representation. This analog signal is produced by connecting discrete digital voltages through the use of a segmented straight line curve fit. This approach significantly reduces out of band harmonics that are normally associated with the stair-step approach while improving the output signal amplitude and phase accuracy. More specifically, the present system and method provides for reconstructing original analog signals from a digitized representation thereof. Digitized signals corresponding to the original analog signals are differentiated and then D to A converted into differentiated analog signals. The differentiated analog signals are then integrated to provide for reconstructed analog signals that correspond to the original analog signals.

17 Claims, 9 Drawing Sheets

- ● SAMPLED DATA POINT
- ── ORIGINAL WAVEFORM
- ---- STAIR-CASE APPROX.

- ---- STAIR-CASE APPROX.
- ── ORIGINAL SIGNAL
- ── PHASE LAG OF APPROX.

LINEAR SIGNAL RECONSTRUCTION SYSTEM AND METHOD

BACKGROUND

The present invention relates generally to signal reconstruction systems and methods, and more particularly, to an improved linear signal reconstruction system and method that employs differentiation of digitized signals followed by linear digital to analog conversion and followed by integration thereof to provide for a more accurate reproduction of an original analog signal.

The reconstruction of analog waveforms from digital representations is an important technology. The most common forms of this reconstruction uses multi-bit digital to analog converters. This techniques has inherent limitations. These limitations include linearity, switching noise (particularly at zero), image rejection at multiples of the sampling frequency, voltage accuracy, phase accuracy, and bandwidth restrictions. These limitations affect system performance and usually result in design trade-offs.

More specifically, the stair-case approximation technique is a traditional digital to analog conversion technique. However, its error function contains the fundamental frequency at a 90 degree phase shift from the original signal plus aliased harmonics. This phase shifted signal varies in amplitude as a function of point density and causes the reconstructed signal to be reduced in amplitude and shifted in phase. Furthermore, spectral analysis of the stair-case approximation show that sampling images are replicated at multiples of the sampling frequencies (aliased harmonics). The magnitude of these images vary as a function of the number of points used to generate the desired baseband signal. That is, the magnitude of the out-of-band images increase as a function of decreasing point density.

Another disadvantage with the stair-case approximation technique is that it introduces a phase lag into the reproduced signal. This phase lag occurs due to the sample-and-hold scheme that is employed. The amount of phase lag introduced by the stair-case approximation is proportional to the number of points used to generate the desired signal. Larger point densities generate smaller phase lag errors.

A fundamental is present in the stair-case approximation technique. Mathematically incorporating this fundamental into a base band signal (subtracting it) results in a signal whose amplitude was less than that of the original signal. This is an undesired amplitude error.

SUMMARY OF THE INVENTION

The present invention is a signal reconstructing or signal processing system and method that provides for improved reproduction of original analog signals derived from recorded digitized signals corresponding to the original analog signals. The signal reconstruction system provides for reconstructing original analog signals from a recorded digitized representation thereof. The system comprises a source of digitized signals that are a recorded version of corresponding analog signals. Differentiation circuitry is coupled to the source of digitized signals for differentiating the digitized signals to provide differentiated digitized signals. Digital to analog converter circuitry is coupled to the differentiation circuitry for converting the differentiated digitized signals into corresponding differentiated analog signals. Integration circuitry is coupled to the digital to analog converter circuitry for integrating the differentiated analog signals to provide for reconstructed analog signals that correspond to the original analog signals.

In a disclosed embodiment of the invention, the differentiation circuitry comprises serial to parallel conversion circuitry for converting serial digitized signals into two sets of parallel digitized signals corresponding to left and right channels, first and second digital differentiation circuits and coupled to outputs of the serial to parallel conversion circuitry, and parallel to serial conversion circuitry is coupled to outputs of the first and second digital differentiation circuits. Each digital differentiation circuit comprises first and second serially coupled latches whose respective outputs are coupled to a digital subtraction circuit that subtracts signals derived from the latches and whose output is coupled to an output latch. The parallel to serial conversion circuitry is coupled to respective outputs of the output latches of the digital differentiation circuits. The integration circuitry comprises a linear reconstruction circuit for integrating the differentiated analog signals, and a low frequency compensation circuit coupled to the linear reconstruction circuit for increasing the low frequency response of the integration circuitry.

The signal reconstruction method of the present invention provides for reconstructing original analog signals from a recorded digitized representations thereof. The method comprises the following steps. A source of digitized signals is provided that comprise a recorded version of corresponding analog signals. The digitized signals are differentiated to provide differentiated digitized signals. The differentiated digitized signals are converted into corresponding differentiated analog signals. The differentiated analog signals are integrated to provide for reconstructed analog signals that correspond to the original analog signals.

The differentiating step comprises converting serial digitized signals into two sets of parallel digitized signals, for each set of parallel digitized signals, sequentially latching successive ones of the parallel digitized signals, subtracting the respective sequentially latched signals to provide for an output signal comprising a differentiated signal, and latching the differentiated signal to provide for latched differentiated signals, and combining the latched differentiated signals from each set of parallel digitized signals into a serial set of differentiated signals. The integrating step comprises the steps of integrating the differentiated analog signals to provide for integrated analog signals, and boosting the low frequency response of the integrated analog signals to increase the low frequency response thereof.

The present invention improves on multi-bit digital to analog converter systems and provides for a technology that minimizes several primary flaws inherent in such multi-bit digital to analog converter systems. By employing the improved linear reconstruction technique of the present invention, the following problem areas are minimized. Noise shaping eliminates high frequency switching noise by reducing the effective analog bandwidth. Image rejection at multiples of the sampling frequency is significantly improved by linearly connecting digitally synthesized points. Voltage accuracy is significantly improved due to the linear connection of the digitally synthesized points. Phase accuracy is significantly improved, in that, phase delay in sinusoids are no longer functionally related to point density due to the linear connection of the digitally synthesized points.

The improved linear reconstruction technique of the present invention may be applied to testing and commercial entertainment applications. More specifically, the present invention may be incorporated in test instrumentation such as arbitrary wave-form generators, and commercial audio components such as CD players, digital preamplifiers, video disc players, and the like.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
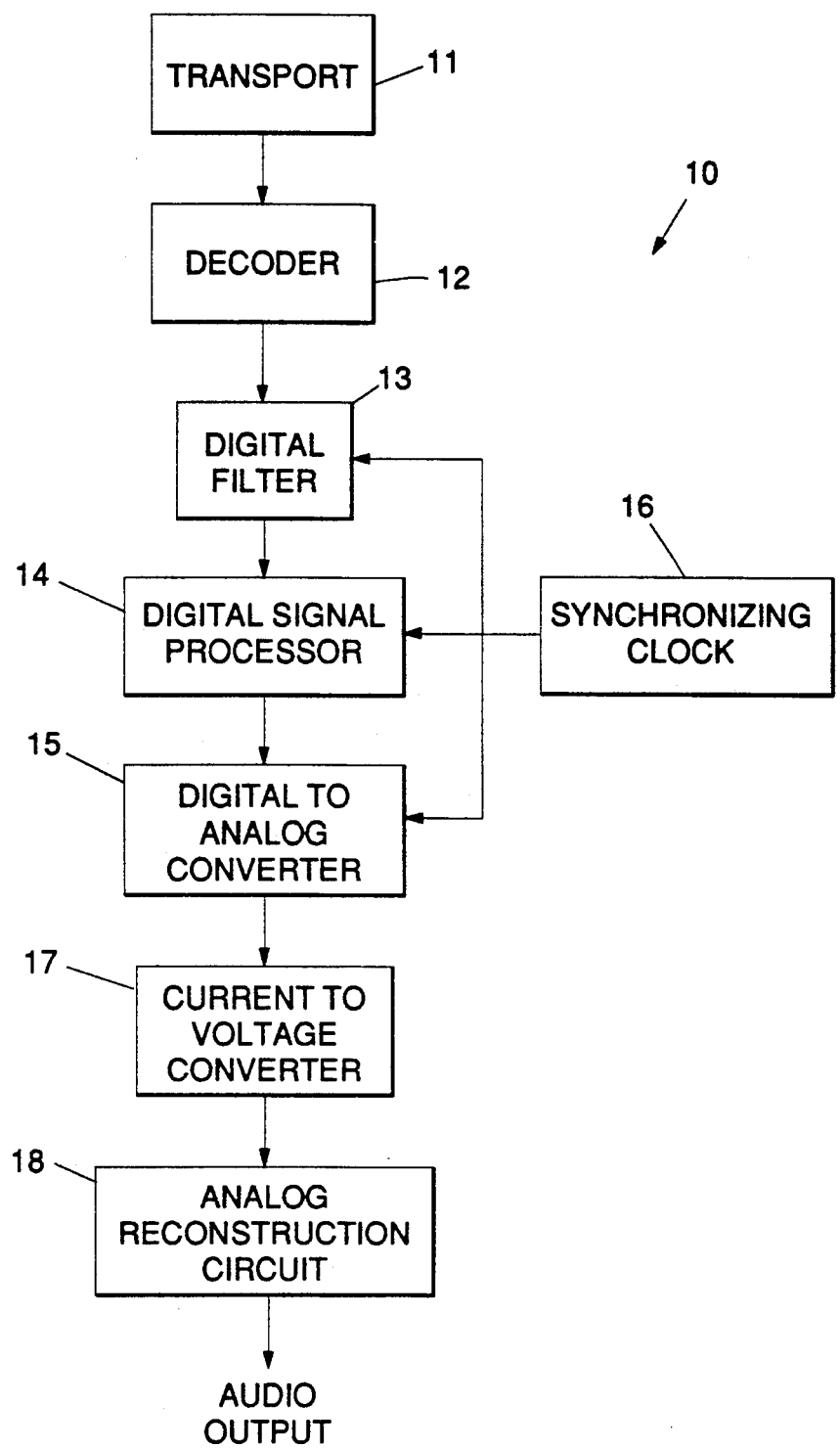
FIG. 1 shows a block diagram of a linear signal reconstruction system in accordance with the principles of the present invention.

Referring to the drawing figures, FIG. 1 is a block diagram of a linear signal reconstruction system 10 in accordance with the principles of the present invention. FIG. 1 also is illustrative of a digital audio signal processing method of the present invention. The system 10 is used with a source of digital audio signals 11, such as a compact disk transport 11 or player, for example, which plays prerecorded compact disks. The transport 11 processes the digitally encoded optical signals that correspond to recorded songs on the disk, and these optical signals are decoded by a decoder 12. The decoder 12 converts the digitally encoded optical signals into electrical signals that are to be processed by the system 10. The system 10 is adapted to process the electrical signals to produce reconstructed audio signals that are representative of the songs recorded on the compact disk. The system 10 is designed to reproduce the recorded songs in a manner that is more like the original performance than has been previously achieved with any digital signal processing equipment used in the audio industry.

The system 10 has been developed as a modification to a conventional compact disk transport 11. The transport 11 includes a digital filter 13, such as a digital brick wall filter, for example, a digital to analog converter 15, a current to voltage converter 17 and a synchronizing clock that synchronizes the digital processing. The present system 10 includes, in addition to the above components, a digital signal processor 14 interposed between the digital filter 13 and the digital to analog converter 15 and an analog reconstruction circuit 18 that processes the output from the current to voltage converter 17.

Figure 2:
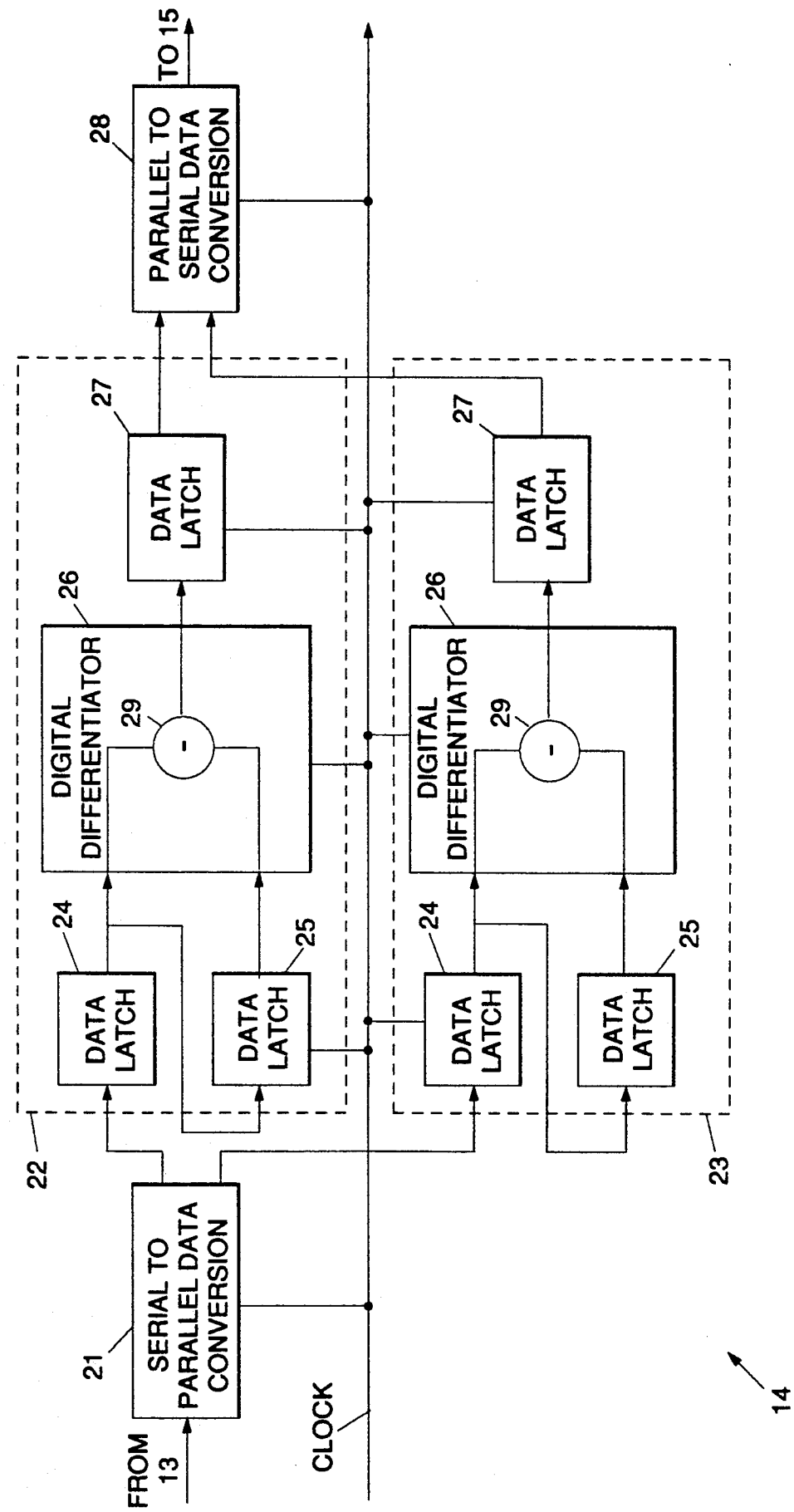
FIG. 2 shows a more detailed block diagram of the digital signal processor employed in the system of FIG. 1.

FIG. 2 shows a more detailed block diagram of the digital signal processor 14 employed in the system 10 of FIG. 1. The digital output from the digital filter 13 is applied to a serial to parallel data converter 21. Outputs from the serial to parallel data converter 21 are applied in parallel to first and second differentiation circuits 22, 23. Many commercial digital to analog converters use a serial data input method to reduce implementation costs and pin count. However, some digital to analog converters employ parallel data inputs. Therefore, the serial to parallel data converter 21 and the parallel to serial data converter 28 are optional. The first and second differentiation circuits 22, 23 process the left and right channel of the audio signals extracted from the recorded audio signals on the compact disk. Each differentiation circuit 22, 23 is comprised of first and second data latches 24, 25, a digital differentiator 26 that is comprised of a subtraction circuit 29, and an output data latch 27. The output of the first data latch 24 is coupled to the second data latch 25 and the respective outputs of the first and second data latches 24, 25 are coupled to the subtraction circuit 29. The digital differentiator circuit 26 subtracts the first and second outputs of the first and second data latches to provide a differentiated output signal. The outputs of the data latches 27 of the respective differentiation circuits 22, 23 are coupled to a parallel to serial data converter 28 whose output is coupled to the digital to analog converter 15.

Figure 3:
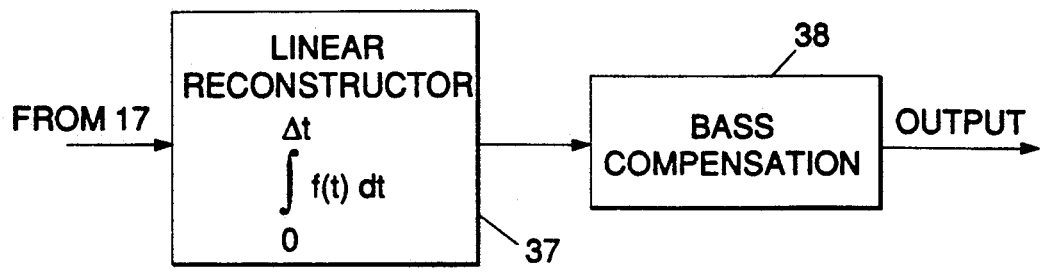
FIG. 3 shows a more detailed block diagram of the analog reconstruction circuit employed in the system of FIG. 1.
Figure 4A:
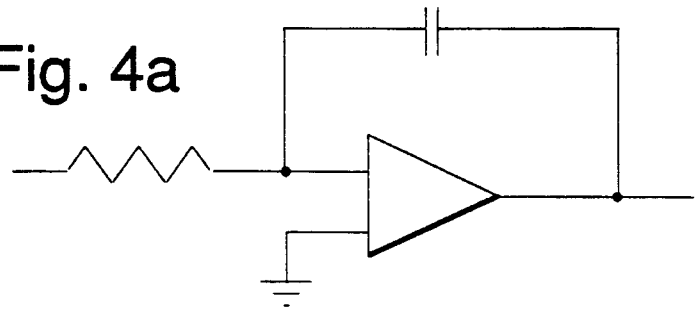
FIG. 4a shows a block diagram of the linear reconstruction circuit of FIG. 3.
Figure 4B:
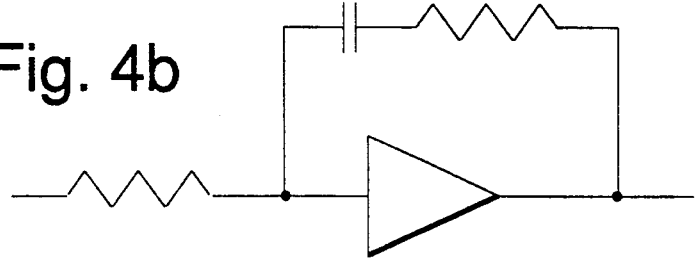
FIG. 4b shows a block diagram of the bass compensation circuit of FIG. 3.
Figure 4C:
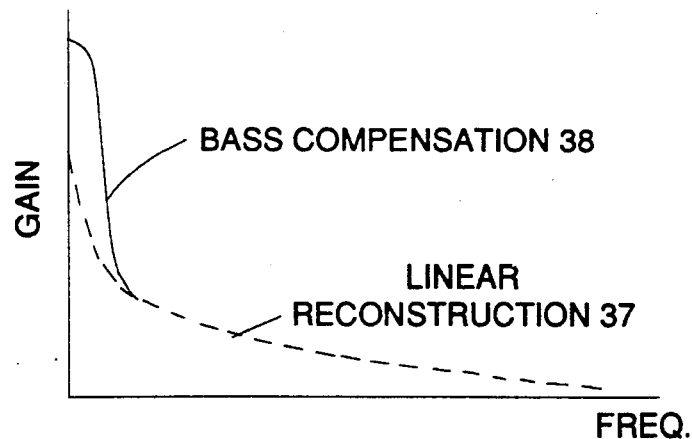
FIG. 4c shows a graph of the response curve provided by the linear reconstruction circuit of FIG. 3.

FIG. 3 shows a more detailed block diagram of the analog reconstruction circuit 18 employed in the system 10 of FIG. 1. The analog reconstruction circuit 18 is comprised of a linear reconstructor circuit 37 that comprises an integrator, and a bass compensation circuit 38 that comprises a bass boost circuit. FIG. 4a shows a detailed block diagram of the linear reconstruction circuit 37 of FIG. 3. The linear reconstruction circuit 37 is a simple integration circuit arrangement whose bandpass is shown in FIG. 4c. FIG. 4b shows a detailed block diagram of the bass compensation circuit 38 of FIG. 3. The bass compensation circuit 38 is adapted to improve the bass response by improving the low frequency response that is limited by the "real world" integrator (shown by the dashed line in FIG. 4c).

It should be clear from FIGS. 1-4 that the essence of the system 10 and signal processing method of the present invention is that the digitized analog signals extracted from the compact disk are differentiated, converted to analog signals, and then integrated to reconstruct the analog signals. The results of this processing is to smooth out the step output normally provided by compact disk digital processors, which provides for a more realistic and improved representation of the original recorded audio signal.

In order to better understand the system 10 and method of the present invention, the theory of operation thereof is presented below. The linear signal reconstruction system 10 and method uses mathematical relationships that exist between discrete time signals, digital to analog conversion characteristics and digital signal processing to produce a highly accurate, low noise, arbitrary analog signal from a discrete digital representation. This analog signal is not produced form a stair-step approximation, which is performed by current systems and processing methods, but by connecting discrete digital voltages through the use of a segmented straight line curve fit. This approach significantly reduces out of band harmonics that are normally associated with the stair-step approach while improving the output signal amplitude and phase accuracy.

Figure 5A:
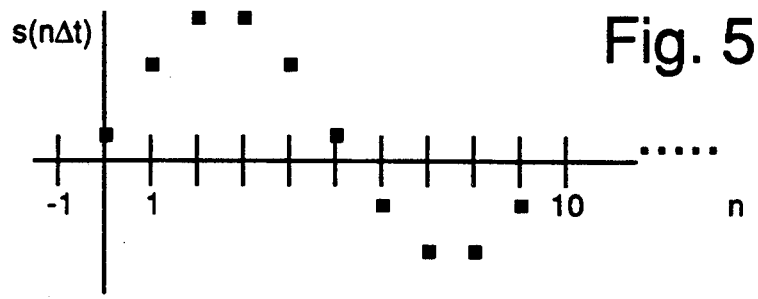
FIGS. 5a and 5b show an original digital signal and a discretely differentiated signal, respectively.
Figure 5B:
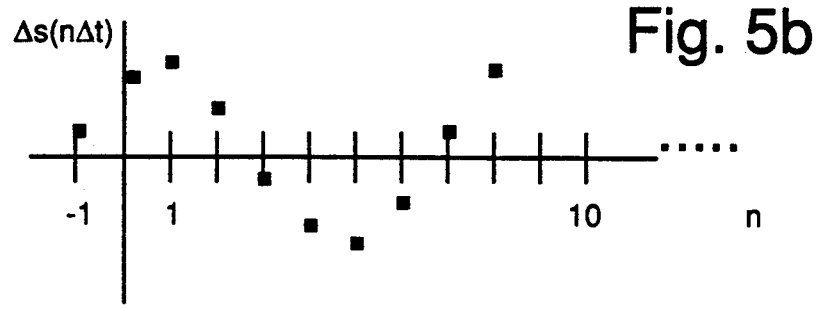

A general mathematical proof and analysis of the present invention is presented below. Referring to FIGS. 5a and 5b, which show an original digital signal and a discretely differentiated signal, respectively, linearly reconstructing an analog signal from its digital representation requires that the digital signal be discretely differentiated.

Let $S(n\Delta t)$ be an arbitrary digital signal, where $\Delta S(n\Delta t)=S[n-1]\Delta t)$, for $0 \leq n \leq N$, where N is the last point in digital signal representation, and $S(-n)=0$. An examination of FIGS. 5a and 5b reveals that after differentiating the signal S ($n\Delta t$), the resultant signal $\Delta S$ ($n\Delta t$) has the same number of points but is displaced in time. The first point, represented by $\Delta S$ ($-\Delta t$), establishes the initial conditions at time $t=0$. Furthermore, it will be shown later that the last point of the analog signal is reconstructed in the analog domain using point $\Delta S([N-1]\Delta t)$.

Figure 6:
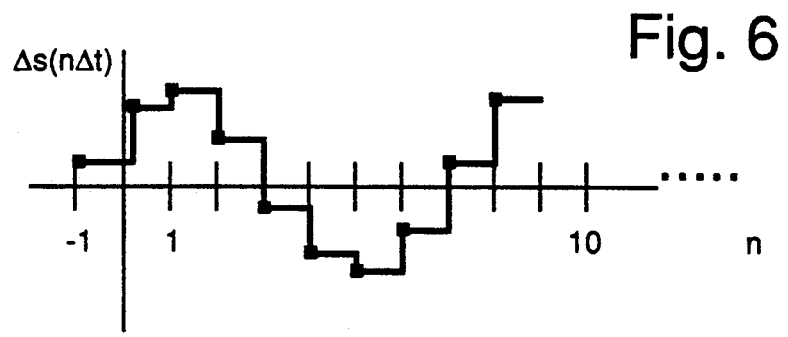
FIG. 6 shows a digital to analog converted signal derived from the discretely differentiated signal of FIG. 5b.

Referring to FIG. 6, it shows a digital to analog converted signal derived from the discretely differentiated signal of FIG. 5b, and at this point, signal $S(n\Delta t)$ has been differentiated and is ready to be applied to the digital to analog converter 15. The output of the digital to analog converter 15 is a stair-step representation of the differentiated signal. In order to recover the original signal, the output of the digital to analog converter 15 must be integrated. This effectively creates a mathematical multiplication of the original signal by one.

$$F(t) = \sum_{n=0}^{N} \int_{n\Delta t}^{[n+1]\Delta t} \Delta S(n\Delta t) \cdot [u(t - n\Delta t)] dt$$

$$F(t) = \left(\frac{1}{\Delta t}\right)\{S(0)\Delta t + [S(\Delta t) - S(0)]\} \cdot t \cdot u(t) \Big|_{0}^{\Delta t} +$$

$$[S(2\Delta t) - S(\Delta t)] \cdot t \cdot (t - \Delta t) \cdot u(t - \Delta t) \Big|_{\Delta t}^{2\Delta t} + \ldots +$$

$$[S(N\Delta t) - S[N-1](\Delta t)] \cdot t - (N-1)\Delta t \cdot$$

$$u(t - [N-1](\Delta t)\Delta t) \Big|_{(N-1)\Delta t}^{N\Delta t}$$

Figure 7A:
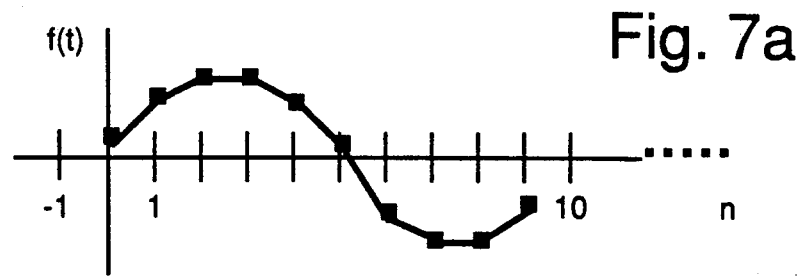
FIGS. 7a and 7b show the linear reconstruction of the digital waveform and a stair step approximation of the same waveform, respectively.
Figure 7B:
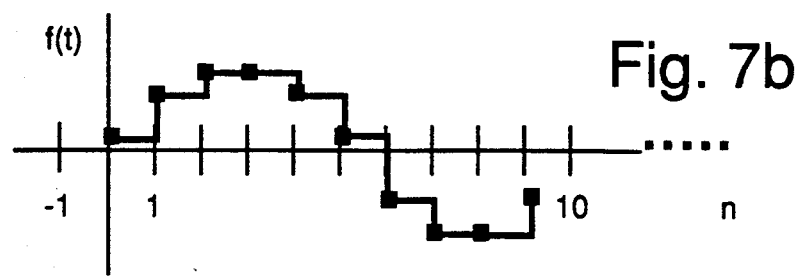

By evaluating the equation for F(t), over values of t ranging from 0 to $N\Delta t$, it can be shown that F(t) equals $S(n\Delta t)$ for values of t equal to $n\Delta t$. Mathematically this means that $F(0)=S(0)$, $F(\Delta t)=S(\Delta t)$ . . . $F(N\Delta t)=S(N\Delta t)$. With reference to FIGS. 7a and 7b, which show the linear reconstruction of the digital waveform and a stair step approximation of the same waveform, respectively, the function F(t) is a linear reconstruction of the digital waveform and represents a better approximation of the true analog waveform when compared against the traditional stair-step approximation.

The following is a mathematical analysis of linearly reconstructed waveforms versus stair-step approximations. Linearly reconstructed waveforms differ significantly from traditional stair-step approximations. The major differences lie in the areas of image rejection (at multiples of the sampling frequency), voltage accuracy, and phase accuracy. To analyze these issues, an understanding of how the point-to-point approximation schemes implemented by the two techniques differ from the original signal.

For purposes of comparison, it will be assumed that the original signal is a sinusoidal in the form of: $v(t)=\sin(\omega t)$. It is necessary to examine the original signal segment by segment in order to outline the approximation errors introduced by the stair-case and linear approximation techniques. If it is assumed that $v(t)$ is sampled at a sampling frequency $f_s$ ($\Delta t=1/f_s$=sampling period) and N is the number of points sampled, the original signal may be rewritten as a summation of point to point segments:

$$v(n,t) = \sum_{n=0}^{N-1} \sin(\omega t) \cdot [u(t - n\Delta t) - u(t - (n+1)\Delta t)].$$

The term $u(t)$ is a STEP function. The term $u(t-t_1)-u(t-t_2)$ is a pulse signal where the pulse ranges from $t_1$ to $t_2$. The summation equation describing the original signal is multiplied by the pulse function $[u(t-n\Delta t)-u(t(n+1)\Delta t)]$ so that the time argument used is valid from point n to point n+1 of the summation, this forces the time argument to be in the range $[n\Delta t] \leq t \leq [(n+1)\Delta t]$ from segment to segment. This operation is used repeatedly during the following description.

Figure 8:
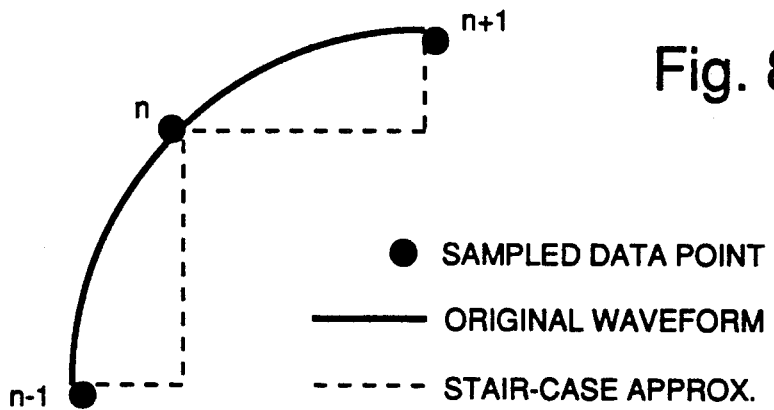
FIG. 8 illustrates the conventional stair-case approximation technique.
Figure 9:
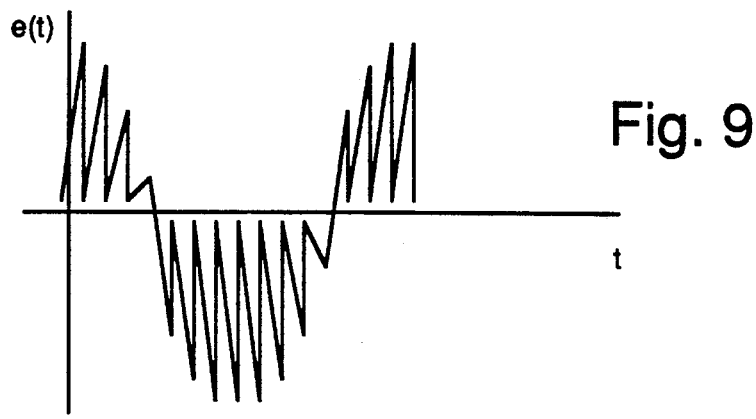
FIG. 9 shows the unfiltered error function derived from the stair-case approximation.

With reference to FIG. 8, which illustrates the staircase approximation technique, it is a traditional digital to analog conversion technique. FIG. 9 shows the unfiltered error function derived from the stair-case approximation. The error function contains the fundamental frequency at a 90 degree phase shift from the original signal. This phase shifted signal causes the reconstructed signal to be reduced in amplitude and shifted in phase (vector summation mathematics). It uses a digital representation of the original signal sampled at frequency $f_s$. Each digital value of the represented signal is input to the digital to analog converter and held at that value until the next digital value is selected.

$$s(n,t) = \sum_{n=0}^{N-1} \sin(\omega n \Delta t) \cdot [u(t - n\Delta t) - u(t - (n + 1)\Delta t)]$$

The term s(n,t) has a constant value from time $n\Delta t$ to time $(n+1)\Delta t$. It is also multiplied by a pulse function so that the time argument is valid from segment to segment.

The approximation error associated with the stair-case approximation technique is derived by simply subtracting the stair-case approximation equation from the original signal equation. Let $e_1(n,t)$ be the stair-case approximation error function given by $$e_1(n,t) = v(n,t) - s(n,t)$$

$$e_1(n,t) = \sum_{n=0}^{N-1} [\sin(\omega t) \cdot [u(t - n\Delta t) - u(t - (n + 1)\Delta t)] - $$

$$\sin(\omega n \Delta t) \cdot [u(t - n\Delta t) - u(t - (n + 1)\Delta t)]]$$

$$e_1(n,t) = \sum_{n=0}^{N-1} [\sin(\omega t) - \sin(\omega n \Delta t)] \cdot$$

$$[u(t - n\Delta t) - u(t - (n + 1)\Delta t)].$$

An equation describing the phase shifted fundamental may be derived in order to subtract it out from the error function. The equation is in the form $k_1\cos(\omega t - \phi)$ where $k_1$ is the peak amplitude and $\phi$ is the phase shift of the phase shifted fundamental signal. It is known that the peak value of the fundamental occurs at the first sampled point (at time $t=\Delta t$), it is also one half the peak amplitude of the original signal. The phase shift must be evenly distributed over all segments, therefore, the phase shifted fundamental signal may be represented as $f(t)=k_1\cos(\omega t - \pi/N)$, where, $k_1=\sin(\omega t)/2$ and is evaluated at $t=\Delta t$ ($\Delta t = 1/f_s$) [i.e., $k_1=\sin(\omega t)/2$].

It is necessary to subtract the phase shifted fundamental signal from the error function. It is thus necessary to describe this signal as a summation of point to point segments, given by $$f(n,t) =$$

$$\sum_{n=0}^{N-1} k_1\cos(\omega t - \pi/N) \cdot [u(t - n\Delta t) - u(t - (n + 1)\Delta t)].$$

The filtered stair-case approximation error function is the error function ($e_1(n,t)$) minus the fundamental and phase shift function (f(n,t)). The filtered stair-case approximation error function is thus $e_{1f}(n,t)$ where $e_{1f}(n,t) = e_1(n,t) - f(n,t)$, or $$e_{1f}(n,t) = \sum_{n=0}^{N-1} [\sin(\omega t) - \sin(\omega n \Delta t) -$$

$$k_1\cos(\omega t - \pi/N)] \cdot [u(t - n\Delta t) - u(t - (n + 1)\Delta t)].$$

Figure 10:
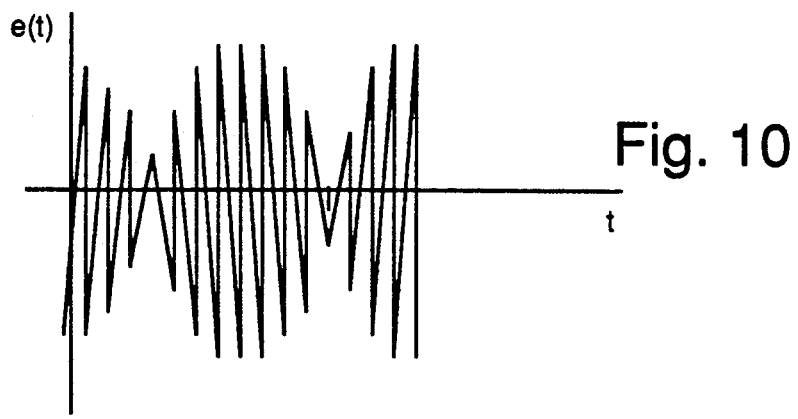
FIG. 10 shows the stair-case approximation filtered error function.

FIG. 10 shows the stair-case approximation filtered error function. The fundamental and phase shift are no longer present. The resultant signal is a double-sideband suppressed carrier signal.

A spectral analysis of the stair-case approximation is as follows. Fast Fourier transform (FFT) computations were performed on the filtered error function of the stair-case approximation technique using various values of N. The results show that the sampling images are replicated at multiples of the sampling frequencies. The magnitude of these images vary as a function of the number of points used to generate the desired baseband signal. That is, the magnitude of the out-of-band images increase as a function of decreasing point density.

Figure 11:
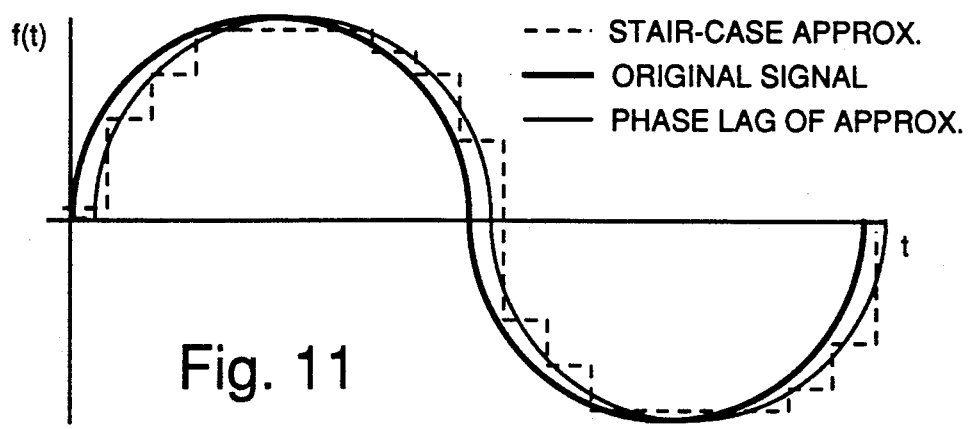
FIG. 11 shows the phase lag associated with the stair-case approximation.

An analysis of the phase error of the stair-case approximation is discussed below. Another disadvantage with the stair-case approximation technique is that it introduces a phase lag into the reproduced signal. This phase lag occurs due to the sample-and-hold scheme that is employed. FIG. 11 shows how the stair-case approximation lags the original signal. The amount of phase lag introduced by the stair-case approximation is proportional to the number of points used to generate the desired signal. Larger point densities generate smaller phase lag errors. A derivation of the phase lag error follows:

The phase shifted fundamental is given by $f(t)=k_1\cos(\omega t - \pi/N)$, and the filtered original signal is given by $s(t)=\sin(\omega t)-k_1\cos(\omega t - \pi/N)$, where $$k_1=\sin(\omega \Delta t)/2 = \sin(2\pi/N)/2$$

so, $$s(t)=\sin(\omega t)-\sin(2\pi/N)\cdot\cos(\omega t - \pi/N)/2.$$

By definition, $$\cos(x)=\sin(\pi/2+x)$$

and therefore, $$s(t)=\sin(\omega t)-\sin(2\pi/N)\cdot\sin(\omega t+\pi/2-\pi/N)$$

and $$\pi/2-\pi/N=\pi(\tfrac{1}{2}-1/N)=\pi(N-2)/2N (N \geq 1)$$

so, $$s(t)=\sin(\omega t)-\sin(2\pi/N)\cdot\sin(\omega t+\pi(N-2)/2N).$$

Using the substitution $-\sin(a+b)=\cos(b)\sin(a)+\sin(b)\cos(a)$ results in $$s(t)=\sin(\omega t)-\sin(2\pi/N)\cdot[\cos(\pi(N-2)/2N)\cdot\sin(\omega t)+\sin(\pi(N-2)/2N)\cdot\cos(\omega t)]/2$$

or, $$s(t)=\sin(\omega t)\cdot[1-\sin(2\pi/N)\cdot\cos(\pi(N-2)/2N)/2]-\sin(2\pi/N)\cdot\sin(\pi(N-2)/2N)\cdot\cos(\omega t)/2$$

Therefore, $s(t)=A\sin\omega t - B\cos\omega t$, where $A = 1 - \sin(2\pi/N)\cdot\cos(\pi(N-2)/2N)/2$, and
$B = \sin(2\pi/N)\cdot\sin(\pi(N-2)/2N)/2$.

The phase ($\partial$) is therefore $\partial = \arctan(-B/A)$.

Figure 12A:
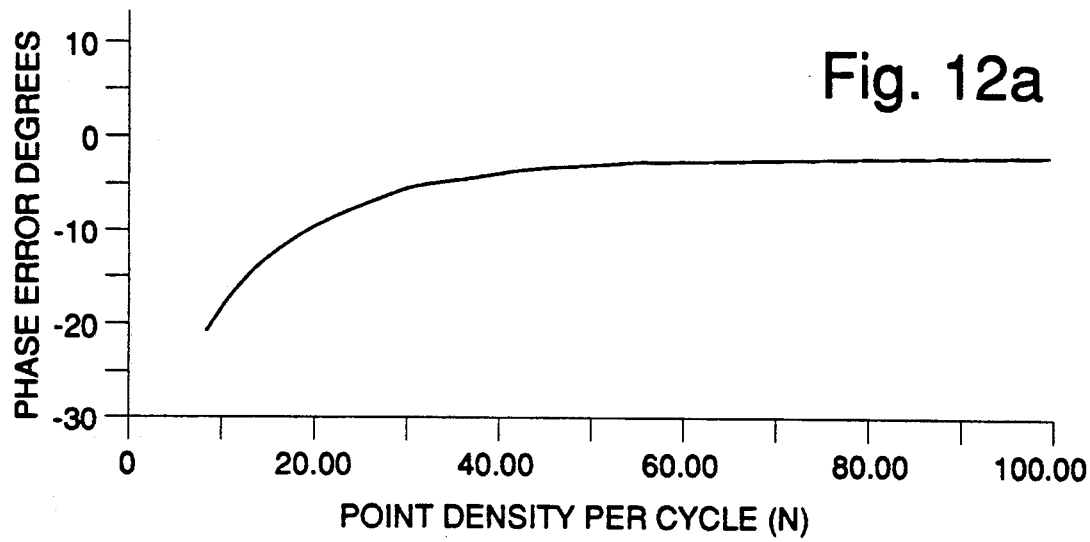
FIGS. 12a and 12b show plots of the phase lag associated with the stair-case approximation technique with respect to point density (N)
Figure 12B:
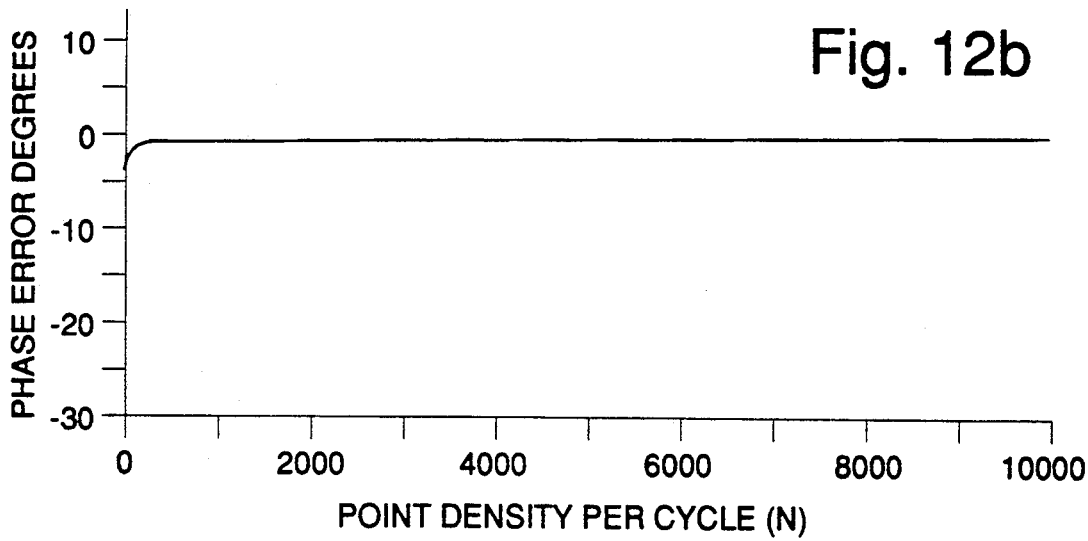

Plots of the phase lag associated with the stair-case approximation technique with respect to point density (N) are shown in FIGS. 12a and 12b.

A fundamental is present in the stair-case approximation technique. Mathematically incorporating this fundamental into a base band signal (subtracting it) results in a signal whose amplitude was less than that of the original signal. This is an undesired amplitude error.

The derivation of the phase error associated with the stair-case approximation method showed that the system output signal could be characterized as follows:

$$s(t) = \sin(\omega t)\cdot[1 - \sin(2\pi/N)\cdot\cos(\pi(N-2)/2N)/2] - \sin(2\pi/N)\cdot\sin(\pi(N-2)/2N)\cdot\cos(\omega t)/2$$

Therefore, $s(t) = A\sin\omega t - B\cos\omega t$, where, $A = 1 - \sin(2\pi/N)\cdot\cos(\pi(N-2)/2N)/2$ and
$B = \sin(2\pi/N)\cdot\sin(\pi(N-2)/2N)/2$ The magnitude of s(t) may be computed as follows:

$$C = (A^2 + B^2)^{\frac{1}{2}}.$$

Figure 13:
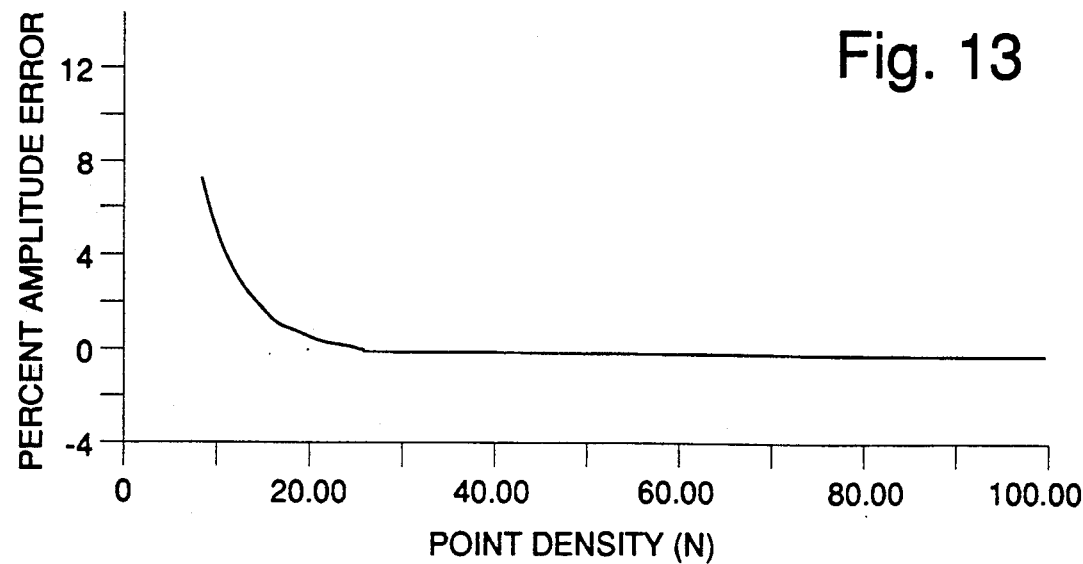
FIG. 13 shows the percentage amplitude error as a function of point density (N)

The amplitude of the original signal is 1 and the amplitude of the system output signal is C. Therefore the amplitude error is (1−C). FIG. 13 shows the percentage amplitude error [(1−C)·100] as a function of point density (N). It can be seen that the amplitude error decreases as the point density increases.

The total harmonic distortion may be calculated by taking the integral of the error function squared. The total harmonic distortion for the stair-case approximation technique is as follows:

$$e_1(n,t) = \sum_{n=0}^{N-1} [\sin(\omega t) - \sin(\omega n\Delta t) - k_1\cos(\omega t) - \pi/N]\cdot[u(t - n\Delta t) - u(t - (n+1)\Delta)].$$

Let $a = \omega n\Delta t$, $b = \omega n\Delta t + \omega\Delta t$ (or $\omega\Delta t(n+1)$), and $2\pi f_c = \omega$, and $1/f_s = \Delta t$.

Substituting variables, $$e_1(n,t) = \sum_{n=0}^{N-1} [\sin(2\pi f_c t) - \sin(a) - k_1\cos(2\pi f_c t - \pi/N)]\cdot[u(t - n\Delta t) - u(t - (n+1)\Delta t)].$$

Squaring, $$e_1^2(n,t) = \sum_{n=0}^{N-1} [\sin^2(2\pi f_c t) + \sin^2(a) + k_1^2\cos^2(2\pi f_c t - \pi/N) - 2\sin(a)\cdot\sin(2\pi f_c t) + 2k_1\sin(a)\cdot\cos(2\pi f_c t - \pi/N) - 2k_1\cos(2\pi f_c t - \pi/N)\cdot\sin(2\pi f_c t)]\cdot[u(t - n\Delta t) - u(t - (n+1)\Delta t)].$$

Integrating, $$\int_0^{N\Delta t} e_1^2(n,t) = \sum_{n=0}^{N-1} [[4\pi/N + \sin(2a) - \sin(2b)]/(8\pi f_c) +$$

Figure 14A:
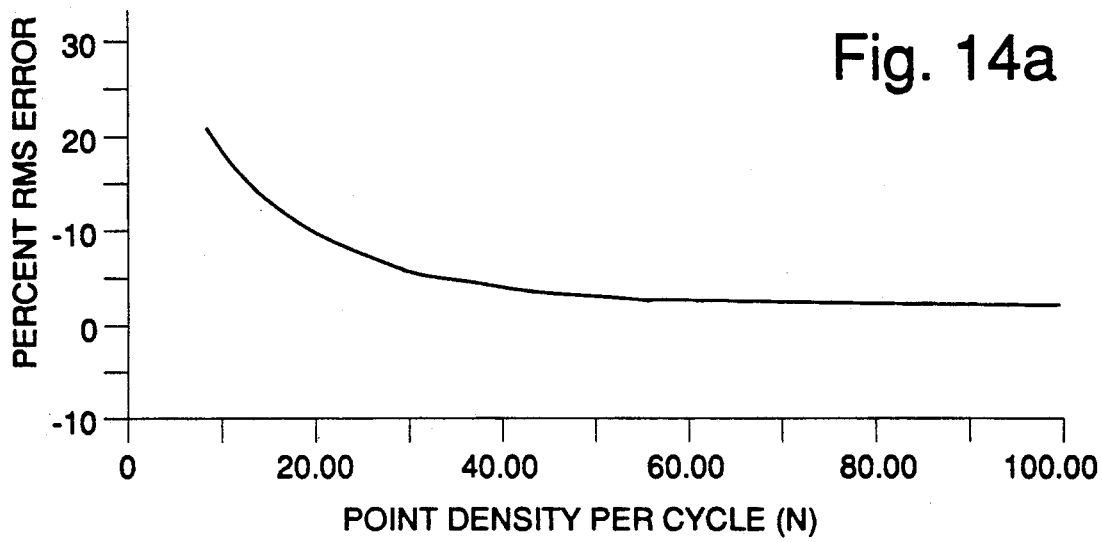
FIGS. 14a and 14b show the total harmonic distortion for the stair-case approximation technique as a function of point density.
Figure 14B:
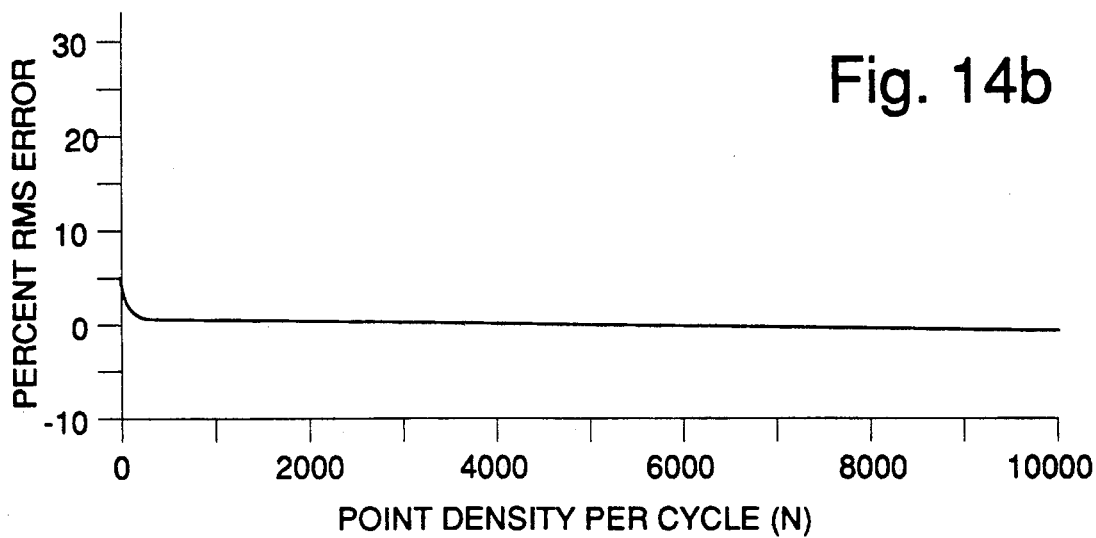

$\sin^2(a)/f_s + [k_1^2/(8\pi f_c)]\cdot[4\pi/N - \sin(2a - 2\pi/N) + \sin(2b - 2\pi/N)] - [\sin(a)/(\pi f_c)]\cdot[\cos(a) - \cos(b)] +$ $[k_1\sin(a)/(\pi f_c)]\cdot[\sin(b - \pi/N) - \sin(a - \pi/N)] -$ $[k_1\cos(\pi/N)/(2\pi f_c)]\cdot[\sin^2(b) - \sin^2(a)] -$ $[k_1\sin(\pi/N)/4\pi f_c)]\cdot[4\pi/N - \sin(2b) + \sin(2a)]]\cdot$ $[u(t - n\Delta t) - u(t - (n+1)\Delta t)].$ The total harmonic distortion (THD) for the stair-case approximation technique as a function of point density is shown in FIGS. 14a and 14b. The theoretical THD for a stair-case approximation has been calculated to be approximately $100\cdot\pi/(\sqrt{3}\cdot N)$. The results obtained from our analysis closely matched this prediction.

Figure 15:
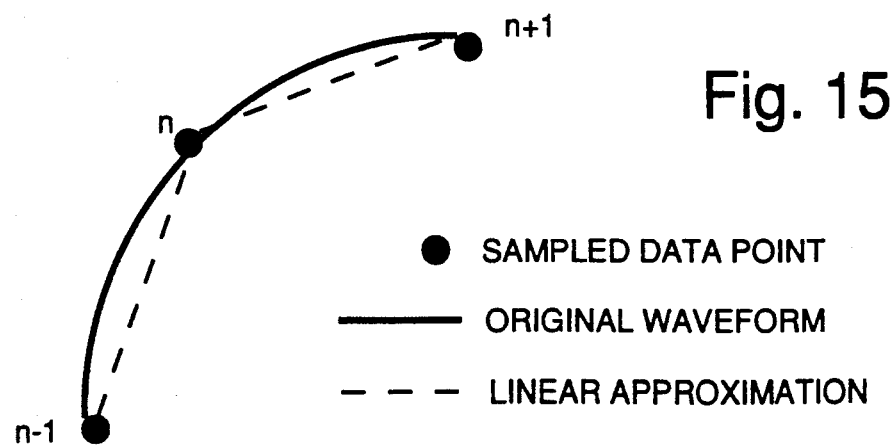
FIG. 15 illustrates the linear approximation technique.

In contrast to the stair-step approach, the linear approximation technique of the present invention connects the sampled point n to the sampled point n+1 using a linear equation. The linear approximation is shown if FIG. 15.

The equation describing this line from point n to point n+1 is l(t), is as follows. The value of original signal at time $n\Delta t$ is $l(n\Delta t) = \sin(\omega n\Delta t)$, the value of original signal at time $[n+1]\Delta t$ is $l([n+1]\Delta t) = \sin(\omega[n+1]\Delta t)$, the slope of line is $\Delta l = [\sin(\omega[n+1]\Delta t) - \sin(\omega n\Delta t)]/\Delta t$, the line equation in $y = mx + b$ form is $l(t) = (\Delta v/\Delta t)t + b$, and $$l(t) = ((\sin(\omega[n+1]\Delta t) - \sin(\omega n\Delta t))/\Delta t)t - + \sin(\omega n\Delta t) - [\sin(\omega(n+1)\Delta t) - \sin(\omega n\Delta t)]n$$

where t is valid in the range $-n\Delta t \leq t < (n+1)\Delta t]$.

The general equation describing the linear approximation for all n is a summation of the individual point to point equations. Let l(n,t) be the linear approximation equation, $$l(n,t) = \sum_{n=0}^{N-1} [((\sin(\omega[n+1]\Delta t) - \sin(\omega n\Delta t))/\Delta t)t +$$

$\sin(\omega n\Delta t) - [\sin(\omega(n+1)\Delta t) - \sin(\omega n\Delta t)]n]\cdot$ $[u(t - n\Delta t) - u(t - (n+1)\Delta t)].$ The approximation error associated with the linear approximation technique is derived by simply subtracting the linear approximation equation from the original signal equation. In other words, let e2(n,t) be the linear approximation error function $$e_2(n,t) = v(n,t) - l(n,t)$$

$$e_2(n,t) = \sum_{n=0}^{N-1} \sin(\omega t)\cdot[u(t - n\Delta t) - u(t - (n+1)\Delta t)] -$$

$[((\sin(\omega[n+1]\Delta t) - \sin(\omega n\Delta t))/\Delta t)t + \sin(\omega n\Delta t) -$ $[\sin(\omega(n+1)\Delta t) - \sin(\omega n\Delta t)]n]\cdot$ $[u(t - n\Delta t) - u(t - (n+1)\Delta t)].$ $$e_2(n,t) = \sum_{n=0}^{N-1} [\sin(\omega t) - ((\sin(\omega[n+1]\Delta t) -$$

$\sin(\omega n\Delta t))/\Delta t)t + \sin(\omega n\Delta t) - [\sin(\omega(n+1)\Delta t) -$ -continued
$$\sin(\omega n\Delta t)]n] \cdot [u(t - n\Delta t) - u(t - (n + 1)\Delta t)].$$

Figure 16:
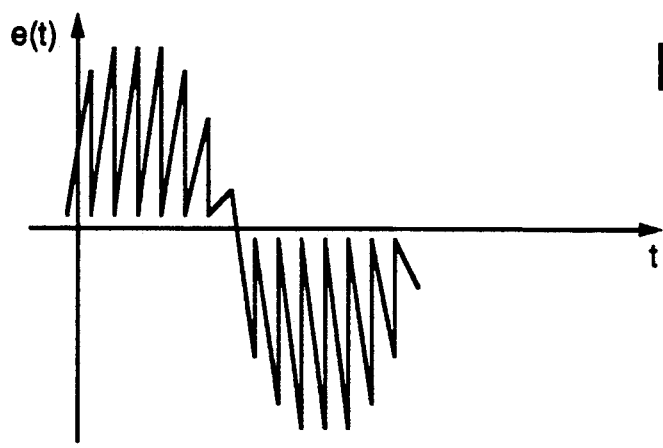
FIG. 16 shows the linear approximation unfiltered error function.

FIG. 16 shows the linear approximation unfiltered error function. The error function contains a baseband fundamental frequency. It is also interesting to note that unlike the stair-case approximation error function, the linear approximation error function does not contain a phase lag. For comparison purposes, the fundamental frequency may be filtered out of the error function.

The equation for the fundamental term f(t) is given by the equation $f(t)=k_2\sin(\omega t)$, where $k_2$ is the peak amplitude of the fundamental, and $k_2$ is given by the equation $k_2 = [1 - (\sin(\omega n/f_s) + \sin(\omega(n+1)/f_s))]/(-2\sin(\omega n/f_s + \pi/N))$. This equation may be rewritten as a summation of a sampled signal at sampling frequency $f_s$. The equation for the fundamental is f(n,t) and it is $$f(n,t) = \sum_{n=0}^{N-1} k_2\sin(\omega t) \cdot [u(t - n\Delta t) - u(t - (n + 1)\Delta t)].$$

Thus, the filtered linear approximation error function is the error function ($e_2(t)$) minus the fundamental function (f(t)). The filtered linear approximation error function is thus $e_{2f}(n,t)$ where $$e_{2f}(n,t) = e_2(n,t) - f(n,t)$$

$$e_{2f}(n,t) = \sum_{n=0}^{N-1} [\sin(\omega t) - ((\sin(\omega[n + 1]\Delta t) -$$

$$\sin(\omega n\Delta t))/\Delta t)t + \sin(\omega n\Delta t) - [\sin(\omega(n + 1)\Delta t) -$$

$$\sin(\omega n\Delta t)]n - k_2\sin(\omega t)] \cdot [u(t - n\Delta t) - u(t - (n + 1)\Delta t)].$$

Figure 17:
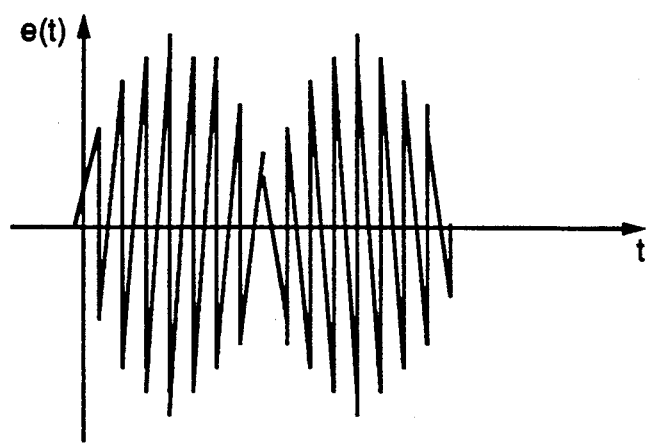
FIG. 17 shows the linear approximation filtered error function.

FIG. 17 shows the linear approximation filtered error function. The fundamental is no longer present. The resultant signal is a double-sideband suppressed carrier signal.

Fast Fourier transform (FFT) computations were performed on the filtered error function of the linear approximation technique using various values of N. The sampling images generated using this method are substantially smaller than those generated using the stair-case approximation method.

The linear approximation phase error is as follows. The equation describing the fundamental was calculated to be $f(t)=k_2\sin(\omega t)$. The fundamental has the same frequency as the original signal and it does not contain a phase lag with reference to the original signal. The fundamental's only contribution to the error function is in amplitude ($k_2$). This is an improvement over the stair-case approximation technique which introduced an unwanted 90 degree phase shift component.

As was discussed previously, there exists a fundamental that is 180 degrees out of phase in the linear approximation method. Mathematically incorporating this fundamental into the base band signal (subtracting it) results in a signal whose amplitude was less than that of the original signal. This is an undesired amplitude error.

The system output signal may be described with the following equation $$s(t)=\sin(\omega t)-k_2\sin(\omega t)$$

or, $$s(t)=(1-k_2)\sin(\omega t).$$

The amplitude of the original signal is 1, the amplitude of the system output signal is $(1-k_2)$. Therefore, the amplitude error is $1-(1-k_2)$ or simply just $k_2$. FIG. 18 shows the percent amplitude error ($k_2 \cdot 100$) as a function of point density (N). It can be seen that the amplitude error decreases as the point density increases.

The total harmonic distortion may be calculated by taking the integral of the error function squared. The total harmonic distortion for the linear approximation technique is as follows:

$$e_{2f}(n,t) = \sum_{n=0}^{N-1} [\sin(\omega t) - ((\sin(\omega[n + 1]\Delta t) -$$

$$\sin(\omega n\Delta t))/\Delta t)t + \sin(\omega n\Delta t) -$$

$$[\sin(\omega(n + 1)\Delta t) - \sin(\omega n\Delta t)]n - k_2\sin(\omega t) \cdot$$

$$[u(t - n\Delta t) - u(t - (n + 1)\Delta t)]$$

Let $a=\omega n\Delta t$, and $b=\omega n\Delta t + \omega\Delta t$ (or $\omega\Delta t(n+1)$) and $2\pi f_c=\omega$, and $1/f_s=\Delta t$
Substituting variables, $$e_{2f}(n,t) = \sum_{n=0}^{N-1} [\sin(2\pi f_c t) - (((\sin(b) - \sin(a))f_s t + \sin(a) -$$

$$[\sin(b) - \sin(a)]n) - k_2\sin(2\pi f_c t)] \cdot$$

$$[u(t - n\Delta t) - u(t - (n + 1)\Delta t)]$$

Simplifying, $$e_{2f}(n,t) = \sum_{n=0}^{N-1} [(1 - k_2) \cdot \sin(2\pi f_c t) - f_s(\sin(b) - \sin(a))t -$$

$$\sin(a) + [\sin(b) - \sin(a)]n] \cdot [u(t - n\Delta t) - u(t(n + 1)\Delta t)]$$

Squaring, $$e_{2f}^2(n,t) = \sum_{n=0}^{N-1} [(1 - k_2)^2 \cdot \sin^2(2\pi f_c t) - f_s^2 \cdot$$

$$(\sin(b) - \sin(a))^2 \cdot t^2 + (\sin(a) - [\sin(b) - \sin(a)] \cdot n)^2 -$$

$$2(1 - k_2) \cdot \sin(2\pi f_c t) \cdot f_s \cdot (\sin(b) - \sin(a)) \cdot t -$$

$$2(1 - k_2) \cdot \sin(2\pi f_c t) \cdot (\sin(a) - [\sin(b) - \sin(a)] \cdot n) +$$

$$2f_s \cdot (\sin(b) - \sin(a)) \cdot (\sin(a) - [\sin(b) - \sin(a)] \cdot n) \cdot t] \cdot$$

$$[u(t - n\Delta t) - u(t - (n + 1)\Delta t)].$$

Integrating, $$\int_0^{N\Delta t} e_{2f}^2(n,t) = \sum_{n=0}^{N-1} [(1 - k_2)^2 \cdot [4\pi/N + \sin(2a) -$$

$$\sin(2b)]/(8\pi f_c) + (\sin(b) - \sin(a))^2 \cdot (3n^2 + 3n + 1)/3f_s +$$

$$[\sin(a) - (\sin(b) - \sin(a)) \cdot n]^2/f_s - (1 - k_2) \cdot f_s \cdot (\sin(b) -$$

$$\sin(a)) \cdot [\sin(b) - b\cos(b) - \sin(a) + a\cos(a)]/(2\pi^2 \cdot f_c^2) -$$

$$(1 - k_2) \cdot (\sin(a) - (\sin(b) - \sin(a)) \cdot n) \cdot (\cos(a) -$$

$$\cos(b))/(\pi f_c) + (\sin(b) - \sin(a)) \cdot (\sin(a) - \sin(b) -$$

$$\sin(a)) \cdot n) \cdot (2n + 1)/f_s] \cdot [u(t - n\Delta t) - u(t - (n + 1)\Delta t)].$$

Figure 18A:
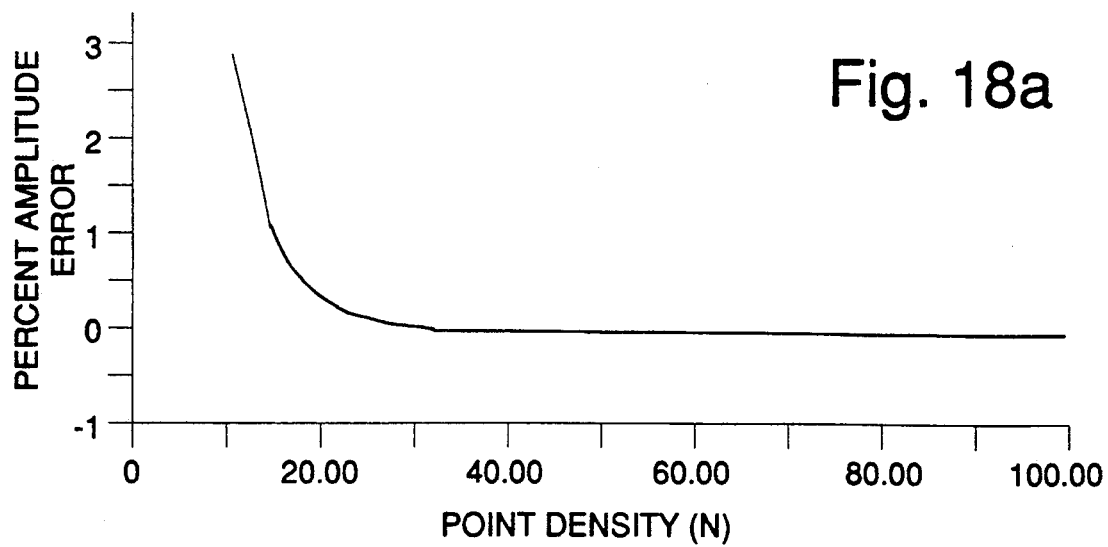
FIGS. 18a and 18b show the total harmonic distortion for the linear approximation technique of the present invention as a function of point density (N)
Figure 18B:
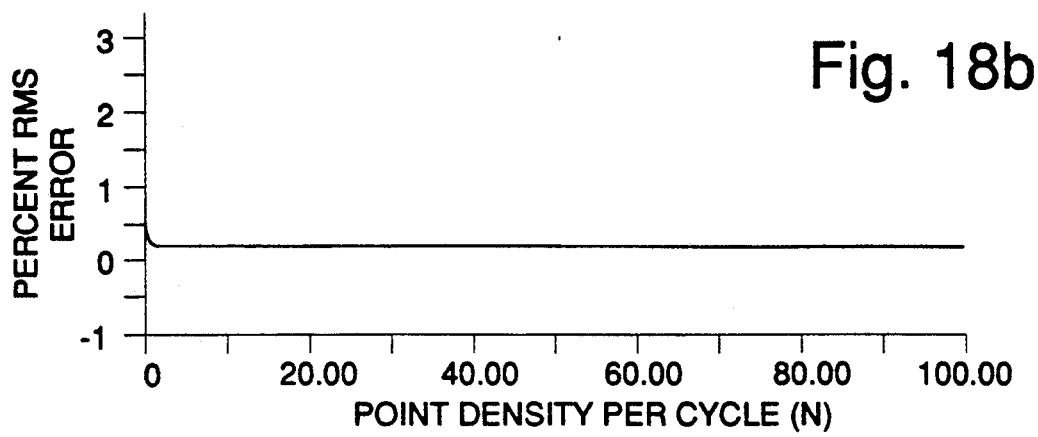

The total harmonic distortion for the linear approximation technique as a function of point density (N) is shown in FIGS. 18a and 18b. Comparing the total harmonic distortion content of this method with the stair-case approximation method shows that this method is substantially better.

In conclusion, the above mathematical analysis has shown that the linear reconstruction system 10 and method of the present invention offers substantial improvements over the traditional stair-case approximation technique in several important areas. These areas include alias rejection, group delay, amplitude accuracy, and total harmonic distortion. For the sake of clarity, each area is summarized individually. Spectral analysis of both techniques reveals that the linear reconstruction technique of the present invention provides better alias rejection. Test data is summarized in Tables 1 through 8. It was also shown that the stair-case approximation technique introduces an unwanted phase lag error (group delay). This phase lag error is a function of point density and the relationship shown in FIGS. 12a and 12b. The linear reconstruction technique of the present invention does not introduce this error.

Figure 19:
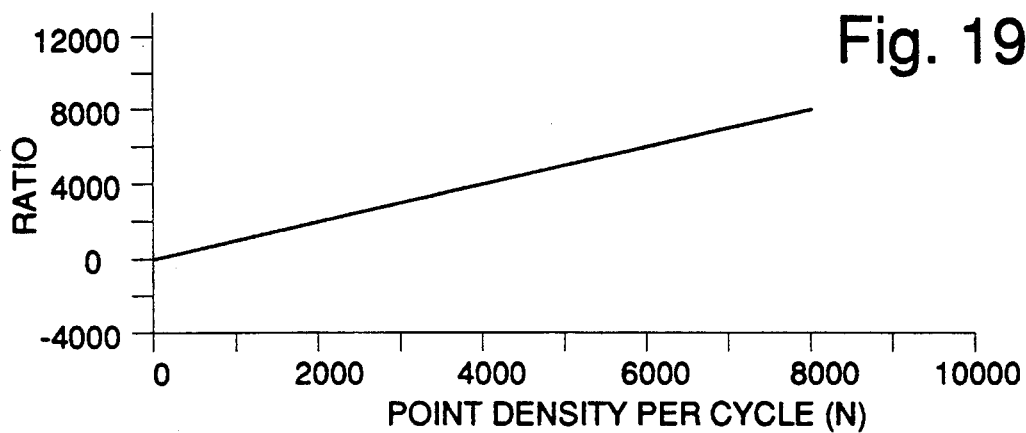
FIG. 19 shows the ratio of the total harmonic distortion of the stair-case approximation versus the total harmonic distortion of the linear reconstruction technique of the present invention.

Both techniques have an amplitude error associated with them that results from the presence of an out of phase fundamental signal resulting from the sampling process. This amplitude error is summarized in FIGS. 13 and 18a. As can be seen, the linear reconstruction technique has an amplitude error which is roughly 50% less than that of the stair-case approximation technique. The total harmonic distortion (THD) was also substantially less using the linear reconstruction technique. FIG. 19 shows the ratio of the THD of the stair-case approximation versus the THD of the linear reconstruction technique. As can be seen, with higher point densities, the linear reconstruction technique of the present invention offers far lower THD. Theoretically, the linear reconstruction technique offers substantial improvements in many key areas when compared against the stair-case approximation technique. It also offers superior performance over all the present conventional approaches.

TABLE 1

Point Sensity Per Cycle: 1764

| General Frequency | Actual Frequency | Piecewise Approx. (Ideal) | Linear Recon. (Ideal) |
|---|---|---|---|
| fc = fs/N | 11,337 Hz | +15 dBm | +15 dBm |
| fs +/− fc | 20 MHz +/− fc | −52 dBm | −118 dBm |
| 2fs +/− fc | 40 MHz +/− fc | −59 dBm | −130 dBm |
| 3fs +/− fc | 60 MHz +/− fc | −62 dBm | −135 dBm |
| 4fs +/− fc | 80 MHz +/− fc | −65 dBm | −138 dBm |

TABLE 2

Point Density Per Cycle: 882

| General Frequency | Actual Frequency | Piecewise Approx. (Ideal) | Linear Recon. (Ideal) |
|---|---|---|---|
| fc = fs/N | 22,675 Hz | +-dBm | +15 dBm |
| fs +/− fc | 20 MHz +/− fc | −47 dBm | −106 dBm |
| 2fs +/− fc | 40 MHz +/− fc | −53 dBm | −118 dBm |
| 3fs +/− fc | 60 MHz +/− fc | −55 dBm | −125 dBm |
| 4fs +/− fc | 80 MHz +/− fc | −58 dBm | −128 dBm |

TABLE 3

Point Density Per Cycle: 196

| General Frequency | Actual Frequency | Piecewise Approx. (Ideal) | Linear Recon. (Ideal) |
|---|---|---|---|
| fc = fs/N | 107,040 Hz | +15 dBm | +15 dBm |
| fs +/− fc | 20 MHz +/− fc | −34 dBm | −80 dBm |
| 2fs +/− fc | 40 MHz +/− fc | −40 dBm | −90 dBm |
| 3fs +/− fc | 60 MHz +/− fc | −43 dBm | −95 dBm |
| 4fs +/− fc | 80 MHz +/− fc | −46 dBm | −98 dBm |

TABLE 4

Point Density Per Cycle: 98

| General Frequency | Actual Frequency | Piecewise Approx (Ideal) | Linear Recon. (Ideal) |
|---|---|---|---|
| fc = fs/N | 204,081 Hz | +15 dBm | +15 dBm |
| fs +/− fc | 20 MHz +/− fc | −28 dBm | −68 dBm |
| 2fs +/− fc | 40 MHz +/− fc | −34 dBm | −79 dBm |
| 3fs +/− fc | 60 MHz +/− fc | −37 dBm | −85 dBm |
| 4fs +/− fc | 80 MHz +/− fc | −40 dBm | −98 dBm |

TABLE 5

Point Density Per Cycle: 49

| General Frequency | Actual Frequency | Piecewise Approx. (Ideal) | Linear Recon. (Ideal) |
|---|---|---|---|
| fc = fs/N | 408,163 Hz | +15 dBm | +15 dBm |
| fs +/− fc | 10 MHz +/− fc | −21 dBm | −55 dBm |
| 2fs +/− fc | 40 MHz +/− fc | −28 dBm | −68 dBm |
| 3fs +/− fc | 60 MHz +/− fc | −31 dBm | −75 dBm |
| 4fs +/− fc | 80 MHz +/− fc | −33 dBm | −78 dBm |

TABLE 6

Point Density Per Cycle: 18

| General Frequency | Actual Frequency | Piecewise Approx. (Ideal) | Linear Recon. (Ideal) |
|---|---|---|---|
| fc = fs/N | 1,111,111 Hz | +15 dBm | +15 dBm |
| fs +/− fc | 20 MHz +/− fc | −13 dBm | −37 dBm |
| 2fs +/− fc | 40 MHz +/− fc | −19 dBm | −49 dBm |
| 3fs +/− fc | 60 MHz +/− fc | −22 dBm | −55 dBm |
| 4fs +/− fc | 80 MHz +/− fc | −25 dBm | −58 dBm |

TABLE 7

Point Density Per Cycle: 12

| General Frequency | Actual Frequency | Piecewise Approx. (Ideal) | Linear Recon. (Ideal) |
|---|---|---|---|
| fc = fs/N | 1,566,666 Hz | +15 dBm | +15 dBm |
| fs +/− fc | 20 MHz +/− fc | −9 dBm | −30 dBm |
| 2fs +/− fc | 40 MHz +/− fc | −15 dBm | −42 dBm |
| 3fs +/− fc | 60 MHz +/− fc | −19 dBm | −48 dBm |
| 4fs +/− fc | 80 MHz +/− fc | −22 dBm | −55 dBm |

TABLE 8

Point Density Per Cycle: 9

| General Frequency | Actual Frequency | Piecewise Approx. (Ideal) | Linear Recon. (Ideal) |
|---|---|---|---|
| fc = fs/N | 2,222,222 Hz | +15 dBm | +15 dBm |
| fs +/− fc | 20 MHz +/− fc | −6 dBm | −25 dBm |
| 2fs +/− fc | 40 MHz +/− fc | −13 dBm | −37 dBm |
| 3fs +/− fc | 60 MHz +/− fc | −17 dBm | −45 dBm |
| 4fs +/− fc | 80 MHz +/− fc | −18 dBm | −48 dBm |

Experimental results of tests performed on an embodiment of the present system 10 are as follows. An arbitrary waveform generator was used to generate sampled sinusoidal signals of varying point densities. In order to establish a baseline, the spectral characteristics of the piecewise approximation were examined using a spectrum analyzer. An integrator circuit capable of generating point-to-point linear reconstruction of the discretely differentiated signals in accordance with the present invention was built. The arbitrary waveform generator was used to generate a discretely differentiated sinusoid. The output of the arbitrary waveform generator was fed into the integrator circuit where the signal was linearly reconstructed. The output of the integrator circuit was then connected to a spectrum analyzer to examine the spectral characteristics of the linearly reconstructed signal.

Figure 20:
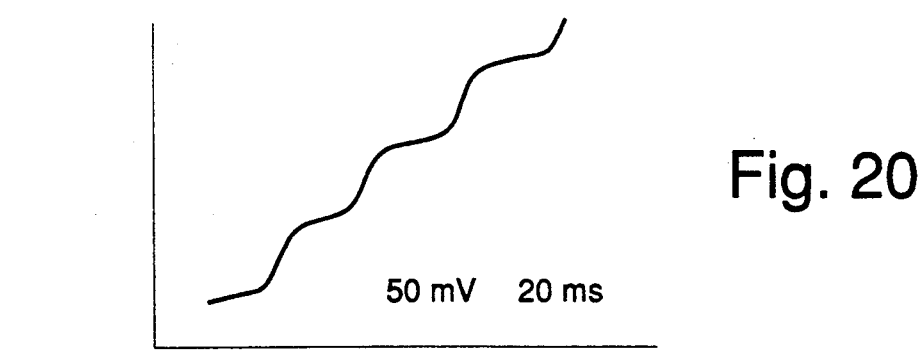
FIG. 20 shows several points of a piecewise approximation (stair-case approximation, while FIG. 21 shows the same points connected using the linear reconstruction technique of the present invention.
Figure 21:
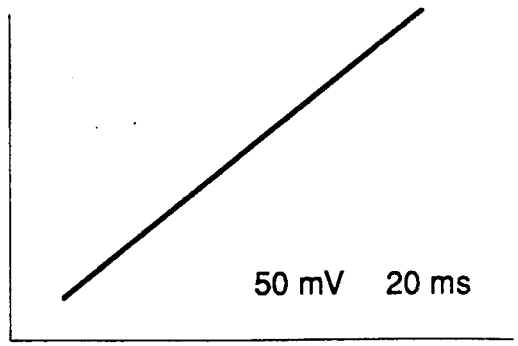

Photographs were taken to compare the actual piecewise approximation against the linear reconstruction technique, and FIGS. 20 and 21 are representative of these photographs. FIG. 20 shows several points of a piecewise approximation (stair-case approximation). It can be seen that the point to point transitions are not very smooth and look like an ascending stair case. FIG. 21 shows the same points connected using the linear reconstruction technique of the present invention. It should be clear that the present linear reconstruction technique is far superior. It generates a signal free of "stair steps" that more closely approximates the original signal.

The linear reconstruction technique of the present invention offers a substantial improvement in the spectral characteristics of the regenerated signal as compared to the stair-case piecewise approximation technique. Tables 9–16 tabulate the results of the tests performed on the stair-case approximation and linear approximation techniques. The ideal results are those mathematically calculated from the filtered error function equations of the two techniques and converted to dBm. The measured results are those that were observed using the arbitrary waveform, integrator circuit, and spectrum analyzer. The measured distortion of the stair-case approximation appears to be better than the theoretical prediction. This is caused by the natural filtering (band-limiting) of the amplifiers used within the arbitrary waveform analyzer. Furthermore, the instruments noise floor account for the additional noise measured for the linear reconstruction method.

TABLE 9

| | | Point Density Per Cycle: 1764 | | | |
|---|---|---|---|---|---|
| General Frequency | Wavetek 1375 Frequency | Piecewise Approx. (Ideal) | Piecewise Approx. (Meas.) | Linear Recon. (Ideal) | Linear Recon (Meas.) |
| $f_c = f_s/N$ | 11,337 Hz | +15 dBm | +15 dBm | +15 dBm | +15 dBm |
| $f_s +/- f_c$ | 20 MHz +/- fc | −52 dBm | −61 dBm | −118 dBm | −98 dBm |
| $2f_s +/- f_c$ | 40 MHz +/- fc | −59 dBm | −74 dBm | −130 dBm | −105 dBm |
| $3f_s +/- f_c$ | 60 MHz +/- fc | −62 dBm | −83 dBm | −135 dBm | −111 dBm |
| $4f_s +/- f_c$ | 80 MHz +/- fc | −65 dBm | −91 dBm | −138 dBm | −88 dBm |

TABLE 10

| | | Point Density Per Cycle: 882 | | | |
|---|---|---|---|---|---|
| General Frequency | Wavetek 1375 Frequency | Piecewise Approx. (Ideal) | Piecewise Approx. (Meas.) | Linear Recon. (Ideal) | Linear Recon (Meas.) |
| $f_c = f_s/N$ | 22,675 Hz | +15 dBm | +15 dBm | +15 dBm | +15 dBm |
| $f_s +/- f_c$ | 20 MHz +/- fc | −47 dBm | −55 dBm | −106 dBm | −101 dBm |
| $2f_s +/- f_c$ | 40 MHz +/- fc | −53 dBm | −69 dBm | −118 dBm | −101 dBm |
| $3f_s +/- f_c$ | 60 MHz +/- fc | −55 dBm | −78 dBm | −125 dBm | −118 dBm |
| $4f_s +/- f_c$ | 80 MHz +/- fc | −58 dBm | −85 dBm | −128 dBm | −85 dBm |

TABLE 11

| | | Point Density Per Cycle: 196 | | | |
|---|---|---|---|---|---|
| General Frequency | Wavetek 1375 Frequency | Piecewise Approx. (Ideal) | Piecewise Approx. (Meas.) | Linear Recon. (Ideal) | Linear Recon (Meas.) |
| $f_c = f_s/N$ | 107,040 Hz | +15 dBm | +15 dBm | +15 dBm | +15 dBm |
| $f_s +/- f_c$ | 20 MHz +/- fc | −34 dBm | −40 dBm | −80 dBm | −110 dBm |
| $2f_s +/- f_c$ | 40 MHz +/- fc | −40 dBm | −55 dBm | −90 dBm | −114 dBm |
| $3f_s +/- f_c$ | 60 MHz +/- fc | −43 dBm | −64 dBm | −95 dBm | −114 dBm |
| $4f_s +/- f_c$ | 80 MHz +/- fc | −46 dBm | −73 dBm | −98 dBm | −92 dBm |

TABLE 12

| | | Point Density Per Cycle: 98 | | | |
|---|---|---|---|---|---|
| General Frequency | Wavetek 1375 Frequency | Piecewise Approx. (Ideal) | Piecewise Approx. (Meas.) | Linear Recon. (Ideal) | Linear Recon (Meas.) |
| $f_c = f_s/n$ | 204,081 Hz | +15 dBm | +15 dBm | +15 dBm | +15 dBm |
| $f_s +/- f_c$ | 20 MHz +/- fc | −28 dBm | −35 dBm | −68 dBm | −90 dBm |
| $2f_s +/- f_c$ | 40 MHz +/- fc | −34 dBm | −50 dBm | −79 dBm | −114 dBm |
| $3f_s +/- f_c$ | 60 MHz +/- fc | −37 dBm | −58 dBm | −85 dBm | −104 dBm |
| $4f_s +/- f_c$ | 80 MHz +/- fc | −40 dBm | −67 dBm | −98 dBm | −90 dBm |

TABLE 13

Point Density Per Cycle: 49

| General Frequency | Wavetek 1375 Frequency | Piecewise Approx. (Ideal) | Piecewise Approx. (Meas.) | Linear Recon. (Ideal) | Linear Recon (Meas.) |
|---|---|---|---|---|---|
| fc = fs/N | 408,163 Hz | +15 dBm | +15 dBm | +15 dBm | +15 dBm |
| fs +/− fc | 20 MHz +/− fc | −21 dBm | −30 dBm | −55 dBm | −68 dBm |
| 2fs +/− fc | 40 MHz +/− fc | −28 dBm | −43 dBm | −68 dBm | −100 dBm |
| 3fs +/− fc | 60 MHz +/− fc | −31 dBm | −52 dBm | −75 dBm | −100 dBm |
| 4fs +/− fc | 80 MHz +/− fc | −33 dBm | −60 dBm | −78 dBm | −92 dBm |

TABLE 14

Point Density Per Cycle: 18

| General Frequency | Wavetek 1375 Frequency | Piecewise Approx. (Ideal) | Piecewise Approx. (Meas.) | Linear Recon. (Ideal) | Linear Recon (Meas.) |
|---|---|---|---|---|---|
| fc = fs/N | 1,111,111 Hz | +15 dBm | +15 dBm | +15 dBm | +15 dBm |
| fs +/− fc | 20 MHz +/− fc | −13 dBm | −20 dBm | −37 dBm | −59 dBm |
| 2fs +/− fc | 40 MHz +/− fc | −19 dBm | −35 dBm | −49 dBm | −82 dBm |
| 3fs +/− fc | 60 MHz +/− fc | −22 dBm | −45 dBm | −55 dBm | −98 dBm |
| 4fs +/− fc | 80 MHz +/− fc | −25 dBm | −51 dBm | −58 dBm | −108 dBm |

TABLE 15

Point Density Per Cycle: 12

| General Frequency | Wavetek 1375 Frequency | Piecewise Approx. (Ideal) | Piecewise Approx. (Meas.) | Linear Recon. (Ideal) | Linear Recon (Meas.) |
|---|---|---|---|---|---|
| fc = fs/N | 1,566,666 Hz | +15 dBm | +15 dBm | +15 dBm | +15 dBm |
| fs +/− fc | 20 MHz +/− fc | −9 dBm | −16 dBm | −30 dBm | −66 dBm |
| 2fs +/− fc | 40 MHz +/− fc | −15 dBm | −30 dBm | −42 dBm | −72 dBm |
| 3fs +/− fc | 60 MHz +/− fc | −19 dBm | −42 dBm | −48 dBm | −74 dBm |
| 4fs +/− fc | 80 MHz +/− fc | −22 dBm | −50 dBm | −55 dBm | −98 dBm |

TABLE 16

Point Density Per Cycle: 9

| General Frequency | Wavetek 1375 Frequency | Piecewise Approx. (Ideal) | Piecewise Approx. (Meas.) | Linear Recon. (Ideal) | Linear Recon (Meas.) |
|---|---|---|---|---|---|
| fc = fs/N | 2,222,222 Hz | +15 dBm | +15 dBm | +15 dBm | +15 dBm |
| fs +/− fc | 20 MHz +/− fc | −6 dBm | −14 dBm | −25 dBm | −75 dBm |
| 2fs +/− fc | 40 MHz +/− fc | −13 dBm | −28 dBm | −37 dBm | −81 dBm |
| 3fs +/− fc | 60 MHz +/− fc | −17 dBm | −39 dBm | −45 dBm | −90 dBm |
| 4fs +/− fc | 80 MHz +/− fc | −18 dBm | −49 dBm | −48 dBm | −100 dBm |

Thus there has been described an improved linear signal reconstruction system and method that employs differentiation of digitized linear digital to analog conversion and followed by signals followed by integration thereof to provide for a more accurate reproduction of an original analog signal. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A signal reconstruction system for reconstructing original analog signals from a recorded digitized representation thereof, said system comprising:
   a source of digitized signals that are a recorded version of corresponding original analog signals;
   differentiation circuitry coupled to the source of digitized signals for differentiating the digitized signals to provide differentiated digitized signals;
   digital to analog converter circuitry coupled to the differentiation circuitry for converting the differentiated digitized signals into corresponding differentiated analog signals; and
   integration circuitry coupled to the digital to analog converter circuitry for integrating the differentiated analog signals to provide for reconstructed analog signals that correspond to the original analog signals.

2. The signal reconstruction system of claim 1 wherein the differentiation circuitry comprises:
   serial to parallel conversion circuitry for converting serial digitized signals into two sets of parallel digitized signals corresponding to left and right channels;
   first and second digital differentiation circuits coupled to outputs of the serial to parallel conversion circuitry that each comprise first and second serially coupled latches whose respective outputs are coupled to a digital subtraction circuit that is adapted to subtract signals derived from the latches and whose output is coupled to an output latch; and
   parallel to serial conversion circuitry coupled to respective outputs of the output latches of the first and second digital differentiation circuits.

3. The signal reconstruction system of claim 2 wherein the integration circuitry comprises:
- a linear reconstruction circuit that is adapted to integrate the differentiated analog signals; and
- a low frequency compensation circuit coupled to the linear reconstruction circuit that is adapted to increase the low frequency response of the integration circuitry.

4. The signal reconstruction system of claim 1 wherein the integration circuitry comprises:
- a linear reconstruction circuit that is adapted to integrate the differentiated analog signals; and
- a low frequency compensation circuit coupled to the linear reconstruction circuit that is adapted to increase the low frequency response of the integration circuitry.

5. The signal reconstruction system of claim 1 wherein the differentiation circuitry comprises:
- serial to parallel conversion circuitry for converting serial digitized signals into two sets of parallel digitized signals corresponding to left and right channels; and
- first and second digital differentiation circuits that each comprise first and second serially coupled latches whose respective outputs are coupled to a digital subtraction circuit that is adapted to subtract signals derived from the latches and whose output is coupled to an output latch.

6. The signal reconstruction system of claim 5 wherein the integration circuitry comprises:
- a linear reconstruction circuit that is adapted to integrate the differentiated analog signals; and
- a low frequency compensation circuit coupled to the linear reconstruction circuit that is adapted to increase the low frequency response of the integration circuitry.

7. The signal reconstruction system of claim 1 wherein the source of digitized signals comprises:
- means for converting recorded optical signals into corresponding digital electrical signals; and
- a digital filter for filtering the digital electrical signals.

8. The signal reconstruction system of claim 7 wherein the means for converting recorded optical signals into corresponding digital electrical signals comprises:
- an optical disk transport mechanism having prerecorded optical patterns that correspond to the original analog signal; and
- a decoder for converting the prerecorded optical patterns into the corresponding digital electrical signals.

9. The signal reconstruction system of claim 8 wherein the differentiation circuitry comprises:
- serial to parallel conversion circuitry for converting serial digitized signals into two sets of parallel digitized signals corresponding to left and right channels;
- first and second digital differentiation circuits coupled to outputs of the serial to parallel conversion circuitry that each comprise first and second serially coupled latches whose respective outputs are coupled to a digital subtraction circuit that is adapted to subtract signals derived from the latches and whose output is coupled to an output latch; and
- parallel to serial conversion circuitry coupled to respective outputs of the output latches of the first and second digital differentiation circuits.

10. The signal reconstruction system of claim 9 wherein the integration circuitry comprises:
- a linear reconstruction circuit that is adapted to integrate the differentiated analog signals; and
- a low frequency compensation circuit coupled to the linear reconstruction circuit that is adapted to increase the low frequency response of the integration circuitry.

11. The signal reconstruction system of claim 8 wherein the differentiation circuitry comprises:
- serial to parallel conversion circuitry for converting serial digitized signals into two sets of parallel digitized signals corresponding to left and right channels; and
- first and second digital differentiation circuits that each comprise first and second serially coupled latches whose respective outputs are coupled to a digital subtraction circuit that is adapted to subtract signals derived from the latches and whose output is coupled to an output latch.

12. The signal reconstruction system of claim 11 wherein the integration circuitry comprises:
- a linear reconstruction circuit that is adapted to integrate the differentiated analog signals; and
- a low frequency compensation circuit coupled to the linear reconstruction circuit that is adapted to increase the low frequency response of the integration circuitry.

13. A signal reconstruction method for reconstructing original analog signals from a recorded digitized representation thereof, said method comprising the steps of:
- providing a source of digitized signals that are a recorded version of corresponding analog signals;
- differentiating the digitized signals to provide differentiated digitized signals;
- converting the differentiated digitized signals into corresponding differentiated analog signals; and
- integrating the differentiated analog signals to provide for reconstructed analog signals that correspond to the original analog signals.

14. The signal reconstruction method of claim 13 wherein the differentiating step comprises the steps of:
- converting serial digitized signals into two sets of parallel digitized signals;
- for each set of parallel digitized signals, sequentially latching successive ones of the parallel digitized signals;
- subtracting the respective sequentially latched signals to provide for an output signal comprising a differentiated signal;
- latching the differentiated signal to provide for latched differentiated signals; and
- combining the latched differentiated signals from each set of parallel digitized signals into a serial set of differentiated signals.

15. The signal reconstruction method of claim 13 wherein the integrating step comprises the steps of:
- integrating the differentiated analog signals to provide for integrated analog signals; and
- boosting the low frequency response of the integrated analog signals to increase the low frequency response thereof.

16. The signal reconstruction method of claim 13 wherein the source of digitized signals provides two sets of parallel digitized signals, and wherein the differentiating step comprises the steps of:

for each set of parallel digitized signals, sequentially latching successive ones of the parallel digitized signals;

subtracting the respective sequentially latched signals to provide for an output signal comprising a differentiated signal;

latching the differentiated signal to provide for latched differentiated signals; and combining the latched differentiated signals from each set of parallel digitized signals into a serial set of differentiated signals.

17. The signal reconstruction method of claim 16 wherein the integrating step comprises the steps of:

integrating the differentiated analog signals to provide for integrated analog signals; and boosting the low frequency response of the integrated analog signals to increase the low frequency response thereof.

* * * * *